United States Patent [19]

Yasumura et al.

[11] 4,360,865
[45] Nov. 23, 1982

[54] BROAD BAND MICROWAVE DETECTOR

[75] Inventors: Gary Yasumura, Santa Clara; Robert D. Genin, San Jose; Scott F. Wetenkamp, Los Altos, all of Calif.

[73] Assignee: Pacific Measurements, Inc., Sunnyvale, Calif.

[21] Appl. No.: 237,715

[22] Filed: Feb. 24, 1981

[51] Int. Cl.³ .................................... H02M 7/06
[52] U.S. Cl. .................................. 363/126; 324/95; 329/206; 333/247
[58] Field of Search .................. 324/95; 363/13, 126; 329/205 R, 206; 455/327, 330; 333/247

[56] References Cited

U.S. PATENT DOCUMENTS

| | | | |
|---|---|---|---|
| 2,925,556 | 2/1960 | Schimmel | 324/95 |
| 3,212,015 | 10/1965 | Kruse | 329/205 R |
| 3,464,010 | 8/1969 | Saul | 324/95 |
| 3,678,395 | 7/1972 | Hunton et al. | 455/330 |
| 4,085,390 | 4/1978 | Standing | 337/247 |

FOREIGN PATENT DOCUMENTS 1072742 1/1960 Fed. Rep. of Germany ........ 324/95

OTHER PUBLICATIONS

Gerst et al., "Stripline Microwave Integrated Circuits", the Microwave Journal, pp. 43–43, May 1969.
Klaus-Dieter Kuchler Hybrid Analysis of Coplanar Transmission Lines, Naval Postgraduate School, Monterey, CA, Jun. 1975, pp. 14, 15, 20–23.

Primary Examiner—William H. Beha, Jr.
Attorney, Agent, or Firm—Limbach, Limbach & Sutton

[57] ABSTRACT

An improved broad band microwave detector of the type including a detector diode, a by-pass capacitor, and a resistive termination wherein fabrication using coplanar transmission line techniques results in a substantial increase in the frequency response of the detector.

9 Claims, 6 Drawing Figures

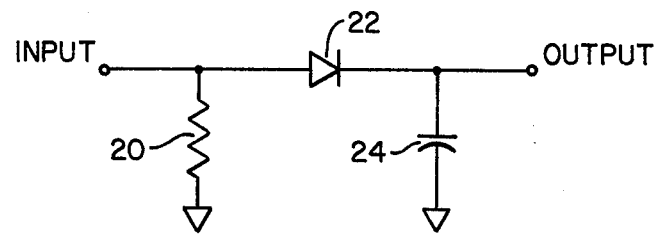
FIG._1.
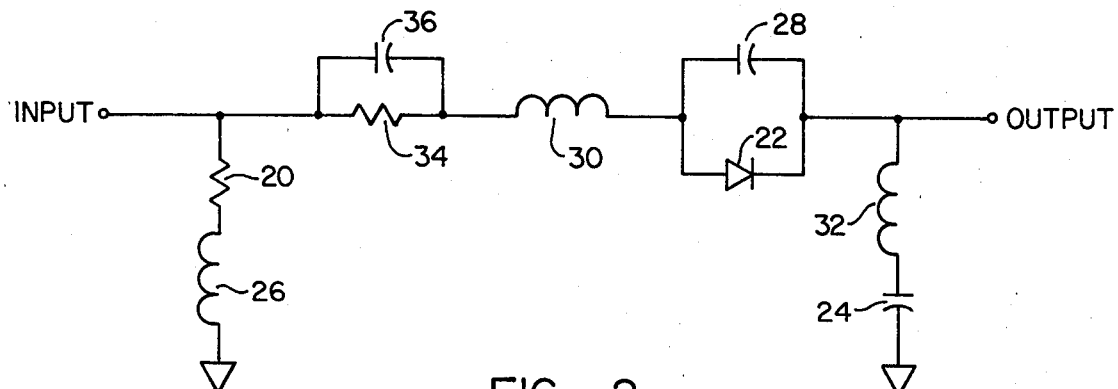
FIG._2.
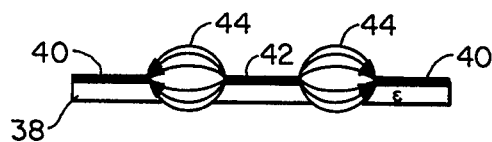
FIG._3.
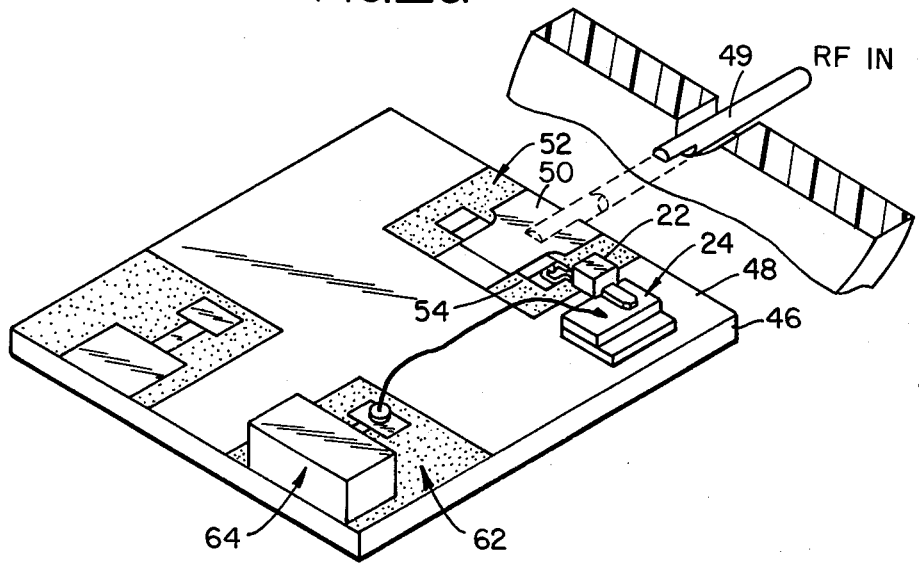
FIG._4.

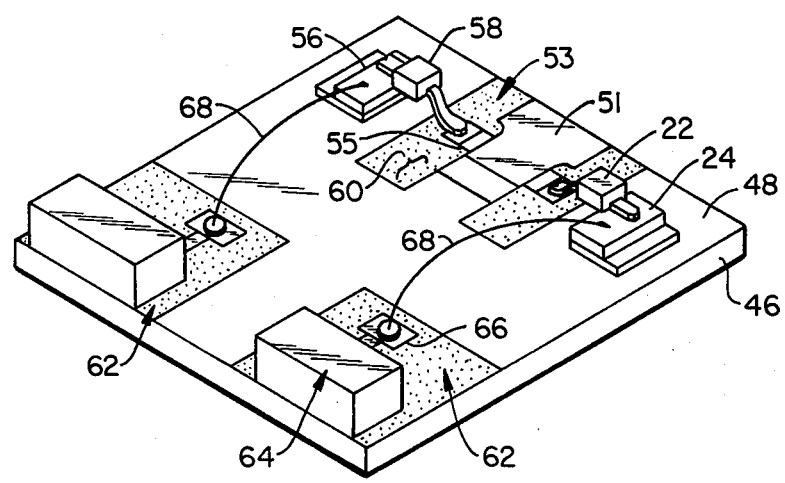
FIG._5.
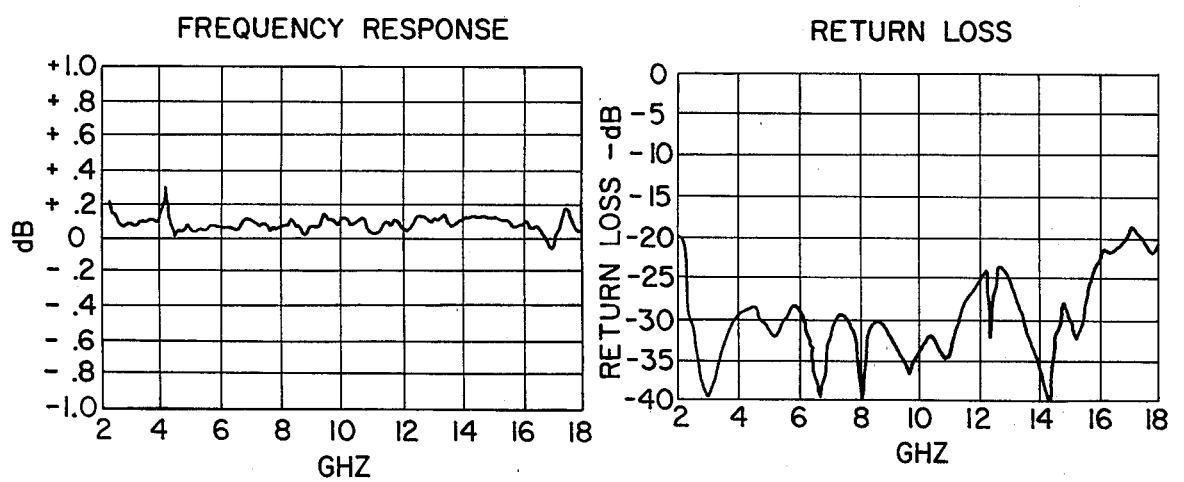
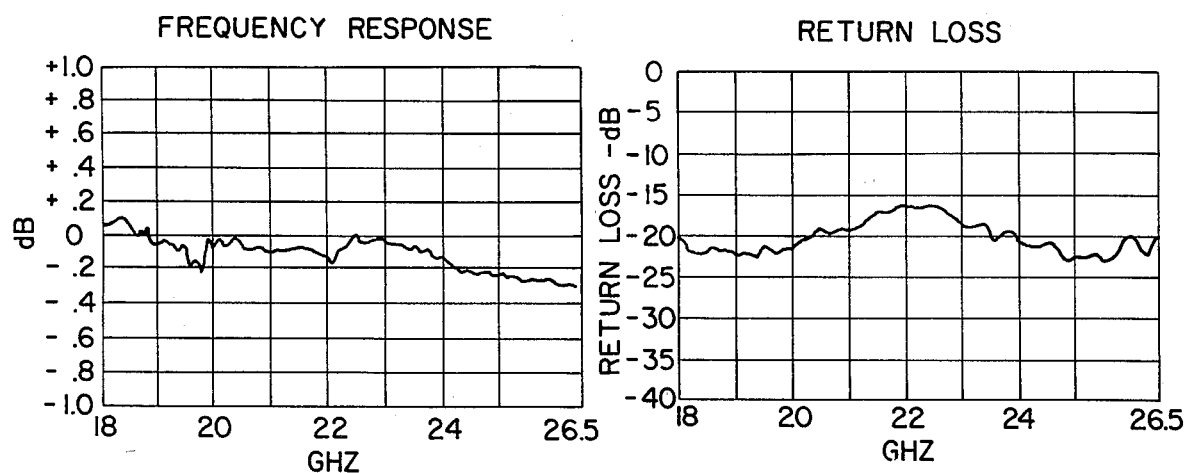
FIG._6.

BROAD BAND MICROWAVE DETECTOR

BACKGROUND OF THE INVENTION

The present invention relates generally to microwave signal detectors and, in particular, to a broad band microwave detector utilizing coplanar transmission lines.

In general, present microwave signal detectors for converting a microwave signal into a DC voltage for the purpose of measuring the power level of the signal are variations of a well known peak voltage detecting circuit. This circuit comprises a rectifying diode whose anode is connected to the alternating current (AC) signal to be measured, and whose cathode is connected to a by-pass capacitor which acts to filter all components of the rectified AC signal, except the direct current (DC) component. In detectors which are used at high frequencies a matching resistance is added to the input of the detector (the anode of the diode) to reduce reflected-wave effects due to impedance mismatches. The components and interconnecting configurations which operate satisfactorily at low frequencies are not useable at microwave frequencies.

For example, at microwave frequencies the rectifying diode will have a significant parallel capacitance, which represents the combined package and junction capacitance of the diode. The by-pass capacitor will have a series inductance, which represents the inductance of the electrical length of the capacitor. The terminating resistance will also have associated with it a series inductance which represents the inductance of the electrical length of the resistive termination. Additionally, a resistance is often placed in series with the diode in order to broaden the frequency response of the detector circuit. At microwave frequencies, there is an inductive component in series with this "deQing" resistance, as well as a parallel capacitance. These represent the inductance and capacitance of the electrical length of the deQing resistance.

It can thus be appreciated that the design of broad band microwave detectors involves more than the interconnection of the basic detector components.

The desirable properties of detectors of this type include: the widest possible useful frequency range, constant voltage output given a constant radio frequency (RF) power input, the lowest possible voltage standing wave ratio (VSWR) across the operating frequency band, maximum sensitivity to signal power, and minimum sensitivity to signal harmonics and DC offsets.

In the past, detector designs have been based upon the use of strip line and microstrip line technology for interconnection and fabrication. The standard strip and microstrip transmission lines are popular in the prior art because they are, mathematically, well characterized through very high frequencies. That is, the mathematical models which describe the response of such transmissions lines are well known. Additionally, strip and microstrip transmission lines are only slightly dispersive. A dispersive transmission line has an impedance which is a non-constant function of frequency. This has allowed designers to do accurate, computer aided designs that optimize the matching of the diode impedance with that of the transmission line.

A microstrip line comprises a broad ground plane and a narrow conducting strip between which is sandwiched a dielectric. The characteristics of the microstrip transmission line are a function of the conductor and ground plane areal relationships, as well as the dielectric characteristics. The electrical fields generated between the conductor and ground plane are contained wholly within the dielectric.

A strip line transmission line comprises two parallel ground planes between which is located the conductor. Sandwiched between each ground plane and the conductor is a dielectric. As with the microstrip transmission line, the characteristics of strip line transmission lines are also a function of the areal relationship between the conductor and the ground planes, as well as the dielectric. Again, the electrical fields generated between the conductor and the ground planes are confined wholly within the dielectric.

When microstrip or strip line technology is used, long ground return paths as well as generally long electrical lengths result. This is because the propagating fields are confined to the dielectric between the conductor and ground plane. Further, component placement when using such lines, often results in abrupt terminations of the transmission line, which increases parasitic problems. These long ground returns, long electrical lengths and abrupt terminations result in additional inductive and capacitive components which in turn cause the detector to have a lower resonant frequency. Low detector resonant frequency translates to lower detector bandwidths.

Designers faced with such low resonances have had to work through them, usually by placing excess inductance in series with the resistive termination at the cathode of the diode, in an effort to compensate for resonant rolloffs. However, such designs, instead of producing maximally flat responses, have resulted in varying frequency responses and have failed to significantly improve the bandwidth of the detector.

In the past, coplanar transmission lines have not been used in the construction of microwave detectors. The coplanar geometry is such that the forward and return paths of the transmission line reside on the same side of the supporting dielectric. For a coplanar transmission line, a significant fraction of the propagating fields resides outside the dielectric, thereby reducing the electrical length of the line. The coplanar line is not frequently used in the microwave art, primarily because it is not as well understood and characterized, as are the microstrip and strip line transmission lines, and because it is dispersive in nature. Additionally, its dispersive character becomes more apparent at lower frequencies than similarly dimensioned strip and microstrip transmission lines.

Contrary to the teachings of the prior art, and in accordance with the teachings of the present invention, it has been discovered that a broad band microwave detector can be fabricated using coplanar transmission line technology to provide detector frequency response bandwidths substantially greater than prior art microwave detectors, and, in general, to provide a significantly improved broad band microwave detector. Experimental results confirm a near 50% improvement in frequency response over diode detectors of the prior art. Additionally, excellent VSWR characteristics are present and fabrication of the device is greatly simplified.

SUMMARY OF THE INVENTION

The foregoing and other problems of prior art broad band microwave detectors are overcome by the present improved broad band microwave detector, having an input port and an output port, for converting microwave signals into corresponding direct current voltages, of the type having a diode, a by-pass capacitor, and a resistive termination, the improvement comprising coplanar transmission line means for forming the resistive termination and for supporting and interconnecting the diode and by-pass capacitor and for receiving the microwave signal from the input port and for supplying the microwave signal to the diode.

In the present invention it has been discovered that despite the dispersive nature of the coplanar transmission line, and the lack of any well known characterization of coplanar lines in the microwave band, the small electrical lengths resulting from the use of coplanar transmission lines permit significant reduction in the parasitic capacitances and inductances which normally plague prior art detectors fabricated using microstrip or strip line transmission lines. As a result, very high resonant frequencies, and hence very broad frequency response, can be achieved.

It is therefore an object of the present invention to provide an improved broad band microwave detector of the type including a diode component, a by-pass capacitor component, and a resistive termination component wherein the components are supported and interconnected, and in the case of the resistive termination fabricated, by coplanar transmission lines.

It is a further object of the present invention to provide a broad band microwave detector having a frequency response which is substantially higher than prior art detectors.

It is a still further object of the present invention to provide a broad band microwave detector wherein fabrication of the detector is substantially simplified over detectors of the prior art.

It is another object of the present invention to provide a balanced broad band microwave detector using coplanar transmission line fabrication techniques.

The foregoing and other objectives, features and advantages of the invention will be more readily understood upon consideration of the following detailed description of certain preferred embodiments of the invention, taken in conjunction with the accompanying drawings.

BRIEF DESCRIPTION OF THE DRAWINGS

FIG. 1 is a schematic diagram of a standard detector circuit.

FIG. 2 is a simplified schematic diagram of the equivalent circuit of the present invention, including parasitic capacitances and inductances.

FIG. 3 is an illustration of the electrical field propagation within a coplanar transmission line.

FIG. 4 is a simplified illustration of the physical layout of the present invention.

FIG. 5 is a simplified illustration of the physical layout of the balanced configuration of the present invention.

FIG. 6 is a graphical illustration of a typical frequency response and return loss plot for diode detectors of the present invention.

DETAILED DESCRIPTION OF THE PREFERRED EMBODIMENT

Referring to FIG. 1, it can be seen that the basic detector circuit includes a terminating resistance 20, which is connected between the anode of a detector diode 22, and ground. The cathode of the detector diode 22 is connected to one end of a by-pass capacitor 24. The other end of the by-pass capacitor 24 is connected to ground. The microwave signal which is to be detected by the detector is supplied to the cathode of the detector diode 22. The resulting detector output level is present at the anode of the detector diode 22.

In the fabrication of this basic detector circuit, the physical characteristics of the components and the fabrication process used introduce additional electrical components into the circuit. FIG. 2 illustrates these additional components. An inductive component 26, resulting from the electrical length of the structure which provides the resistive termination 20, is produced which is in series with the resistive termination 20. There is a capacitive component 28 associated with the detector diode 22. This detector diode capacitance 28 represents the junction capacitance of the diode as well as the capacitance of the package of the diode. Also associated with the detector diode 22 is a parasitic inductance 30 which represents the electrical lengths between the diode and other components. Additionally, the by-pass capacitor 24 has associated with it an inductive component 32 which corresponds to the electrical length of the by-pass capacitor 24.

In order to flatten the response of microwave detector circuits, a resistance is often placed in series with the detector diode 22. In FIG. 2 this resistance is indicated by reference numeral 34. Associated with this resistance 34, is a parasitic capacitance 36 which is in parallel with the resistive component 34. These various additional inductances and capacitances contribute to modify the theoretical response of the microwave detector.

Referring now to FIG. 3, a coplanar transmission line is illustrated. The coplanar transmission line is characterized by a sheet of dielectric 38, and a ground plane 40 and conductor 42 which are disposed on the same side of the dielectric sheet 38. Typically, the conductor 42 is flanked by the ground planes 40. The electrical field propagation within the coplanar transmission line is illustrated by arrows 44. It can be seen that a significant proportion of electrical field propagation occurs outside of the dielectric 38. While this adds to the dispersive characteristics of coplanar transmission lines, it also permits short electrical lengths.

Referring now to FIG. 4, the physical layout of the present invention will be described. In the present invention, a dielectric sheet 46 supports the ground plane 48 and the conductor 50 of the coplanar transmission line. The ground plane 48 substantially covers the dielectric surface, except for a slot 52 which is located adjacent to one edge of the dielectric sheet 46. Located within this slot 52 is the conductor 50. The conductor 50 receives the microwave signal to be detected from the input port of the detector (not shown). The conductor 50 is also shaped and positioned to provide a resistive termination for the input line 49 from the input port. In the preferred embodiment of the present invention, the conductor 50 has a "T" shape. The microwave signal input is supplied to the "cap" portion of the conductor 50. This cap portion has a predetermined width to supply the appropriate 50 ohm terminating resistance 20. The vertical portion of the "T" is shaped to provide the deQing resistance 34. A connecting pad 54 is positioned at the bottom of the "T" for receiving the cathode of the diode 22. As can be seen from FIG. 2, the body of the diode 22 is positioned between the conductor 50 and the ground plane 48 so that the diode body is within 0.02 inches of the launch. The by-pass capacitor 24 is bonded at one end to the ground plane 48 so that the capacitor is located adjacent to the slot 52 and the conductor 50. The anode of the diode 22 is bonded directly to the top of the by-pass capacitor 24.

The capacitor 24 is preferably of a low dielectric type, and of minimum thickness, for example 3 mils. The bond between the capacitor 24 and the ground plane 48 is preferably eutectic; that is, utilizing a bonding material having a low melting point.

Except for some slight fringing capacitance across the resistive termination 20, the conductor 50 is well terminated, and the diode 22 is incorporated as a part of the conductor instead of being a part of an abrupt termination. This tends to reduce the effective parasitics of the diode which improves the resonant frequency of the circuit even further.

Because the parasitic capacitance 28 of the diode 22 is reduced by the geometry of the present invention, the compensating inductive component 26 which is typically added to offset the effects of the diode parasitic capacitance 48, need not be very large. In the present invention, in the case of the detector using a single diode 22, the physical length of the resistive termination 20 is sufficient to supply such compensating inductance 26. Additionally, because the by-pass capacitor 24 has a small thickness, the parasitic inductive component 32 is small.

Referring now to FIG. 5, the physical geometry of a balanced detector will be described. This balanced detector configuration supplies a second output signal which is proportional to the negative going peak values of the input microwave frequency. The additional components required for the balanced detector include a second by-pass capacitor 56 and a second detector diode 58. The slot 53 in the ground plane 48 is deeper than the slot 52 used in the single ended detector of FIG. 2. This is to permit an additional compensating inductive component to be added in series with the conductor 51, in the form of a small tab 60 of ground plane. The additional capacitor 56 and diode 58 are connected to the ground plane 48 and conductor 51 opposite the first diode 22 and first capacitor 24. In the balanced configuration, the anode of the diode 58 is connected to the conductor 51 via connecting pad 55. As before, one end of the by-pass capacitor, in this case capacitor 56, is bonded to the ground plane 48 so that the capacitor is adjacent to the slot 53 and the conductor 51. The cathode of the detector diode 58 is bonded directly to the top of the by-pass capacitor 56. Again, the body of the diode, in this case diode 58, is positioned between the conductor 51 and the ground plane 48 so as to be within 0.02 inches of the launch.

In order to supply the detected signal level to the outputs of both the single ended and the balanced detectors, slots 62 are made in the ground plane 48 at the end of the dielectric and opposite to the detector circuitry. Positioned within these slots 62 are structures 64 for receiving connections from the detector output port (not shown). Also included are structures 66 for receiving a connecting wire 68 which is connected to the top of the by-pass capacitor 24 and 56.

The overall effect of this coplanar design is a significant reduction in parasitics which results in a very broad band frequency response of the detector and improved VSWR. This can be seen by examining the graphs of FIG. 6. As can be seen, the frequency response of a typical single ended detector of the present invention is flat to within 0.3 dB, up to 26.5 GHz. While the response and VSWR performance of the balanced configuration approach that of the single-ended configuration, the balanced configuration is less sensitive to signal harmonics and DC offsets than is the single-ended configuration.

The terms and expressions which have been employed here are used as terms of description and not of limitation, and there is no intention, in the use of such terms and expressions of excluding equivalents of the features shown and described, or portions thereof, it being recognized that various modifications are possible within the scope of the invention claimed.

What is claimed is:

1. An improved broad-band microwave detector, having an input port, for converting microwave signals into corresponding direct current voltages, of the type having a diode, a by-pass capacitor, and a resistive termination, the improvement comprising
coplanar transmission line means for forming the resistive termination and for supporting and interconnecting the diode and by-pass capacitor, and for receiving the microwave signal from the input port and supplying the microwave signal to the diode.

2. A broad-band microwave detector, having an input port and an output port, for converting microwave signals into corresponding direct current voltage levels comprising
a sheet of dielectric material of predetermined thickness having a top surface and a bottom surface;
a ground plane sheet of conducting material of predetermined thickness substantially covering the top surface of the dielectic, the ground plane having a slot located adjacent to an edge of the dielectric;
a coplanar transmission line comprising a strip of conducting material, the strip of conducting material having predetermined length, width, and shape to form a resistive termination having a predetermined value when the conducting material is positioned within the slot and bonded to the dielectric material;
a by-pass capacitor having a top and a bottom, the bottom being connected to the ground plane adjacent to the slot and the coplanar transmission line;
a diode, having an anode and a cathode, the cathode being connected to the coplanar transmission line for receiving the microwave signal and the anode being connected to the top end of the by-pass capacitor;
input coupling means for supplying the microwave signal from the input port to the coplanar transmission line; and
output coupling means for connecting the top of the by-pass capacitor to the output port of the detector.

3. The broad-band microwave detector of claim 2, wherein the by-pass capacitor has low inductance a low-loss dielectric and a thickness of approximately 3 mils.

4. The broad-band microwave detector of claim 2, wherein the resistive termination has a value of approximately 50 ohms.

5. The broad-band microwave detector of claim 2, wherein the diode is a crystal diode.

6. The broad-band microwave detector of claim 2, wherein the coplanar transmission line has predetermined electrical length to form an equivalent series resistance in the signal path between the microwave signal input and the cathode of the diode, to deQ the detector resonant response.

7. The broad-band microwave detector of claim 2, further including
a second diode having an anode and a cathode, the anode being connected to the coplanar transmission line;
a second by-pass capacitor having a top and bottom, the bottom being bonded to the ground plane adjacent to the edge of the slot opposite from the first by-pass capacitor, and positioned so that the capacitor is parallel to the coplanar transmission line, the top of the by-pass capacitor being connected to the cathode of the diode; and
a second output coupling means for coupling the output port to the top of the second by-pass capacitor.

8. The broad-band microwave detector of claim 7 wherein the coplanar transmission line is shaped to provide a compensating inductive component.

9. A broad-band microwave detector, having an input port and an output port, for converting microwave signals into corresponding direct current voltage levels, comprising
a supporting dielectric sheet having a top surface and a bottom surface and a predetermined thickness;
a ground plane sheet of conducting material having a predetermined thickness, the ground plane substantially covering the top surface of the dielectric sheet, and wherein the ground plane sheet has a rectangular slot centered adjacent to one edge of the dielectric;
a T-shaped coplanar transmission line having a length which is no greater than 50 mils and a width which is no greater than 50 mils and having an approximate 50 ohm resistive terminating value when centered in the slot and bonded to the dielectric material;
a low dielectric by-pass capacitor having a thickness of approximately 3 mils, the capacitor having a top and a bottom, the bottom being bonded to the ground plane adjacent to the rectangular slot and parallel with the coplanar transmission line;
a crystal diode, having a high switching speed, and an anode and a cathode, wherein the anode is bonded directly to the coplanar transmission line and the cathode is bonded directly to the top of the capacitor so that the diode is positioned approximately 20 mils above the ground plane;
input coupling means for supplying the microwave signal from the input port to the coplanar transmission line; and
output coupling means for connecting the top of the capacitor to the output port.

* * * * *